United States Patent
Yang et al.

(10) Patent No.: US 12,243,591 B2
(45) Date of Patent: Mar. 4, 2025

(54) IN-PLACE WRITE TECHNIQUES WITHOUT ERASE IN A MEMORY DEVICE

(71) Applicant: SanDisk Technologies LLC, Addison, TX (US)

(72) Inventors: Xiang Yang, Santa Clara, CA (US); Jiacen Guo, Cupertino, CA (US); Takayuki Inoue, Fujisawa (JP)

(73) Assignee: Sandisk Technologies, Inc., Milpitas, CA (US)

( * ) Notice: Subject to any disclaimer, the term of this patent is extended or adjusted under 35 U.S.C. 154(b) by 228 days.

(21) Appl. No.: 17/896,587

(22) Filed: Aug. 26, 2022

(65) Prior Publication Data

US 2024/0071508 A1    Feb. 29, 2024

(51) Int. Cl.
| | |
|---|---|
| *G11C 7/00* | (2006.01) |
| *G11C 16/08* | (2006.01) |
| *G11C 16/10* | (2006.01) |
| *G11C 16/14* | (2006.01) |
| *G11C 16/34* | (2006.01) |

(52) U.S. Cl.
CPC ............ *G11C 16/102* (2013.01); *G11C 16/08* (2013.01); *G11C 16/14* (2013.01); *G11C 16/3459* (2013.01)

(58) Field of Classification Search
CPC ....... G11C 16/102; G11C 16/08; G11C 16/16; G11C 16/3459
USPC ................................................... 365/189.011
See application file for complete search history.

(56) References Cited

U.S. PATENT DOCUMENTS

| | | | |
|---|---|---|---|
| 8,917,559 B2 | 12/2014 | Bisen | |
| 9,972,396 B1 | 5/2018 | Naik et al. | |
| 10,090,044 B2 | 10/2018 | Achtenberg et al. | |
| 10,359,933 B2 | 7/2019 | Muchherla et al. | |
| 11,482,292 B1* | 10/2022 | Linnen | G11C 11/5671 |
| 11,640,262 B2* | 5/2023 | Helm | G06F 3/0673 |
| | | | 711/154 |
| 11,886,741 B2* | 1/2024 | Patil | G06F 3/0611 |
| 11,955,199 B2* | 4/2024 | Li | G11C 7/1063 |
| 11,960,722 B2* | 4/2024 | Tanaka | G06F 3/0608 |
| 12,001,709 B2* | 6/2024 | Kim | G06F 3/0679 |
| 2012/0250408 A1* | 10/2012 | Takeyama | G11C 11/5628 |
| | | | 365/185.03 |
| 2021/0200471 A1 | 7/2021 | Kim et al. | |
| 2021/0343352 A1* | 11/2021 | Cho | G11C 16/26 |
| 2021/0349662 A1* | 11/2021 | Helm | G06F 3/0659 |

* cited by examiner

*Primary Examiner* — Viet Q Nguyen
(74) *Attorney, Agent, or Firm* — Dickinson Wright PLLC; Steven C. Hurles

(57) ABSTRACT

The memory device includes a plurality of memory blocks, each including a plurality of memory cells arranged in a plurality of word lines. Control circuitry is in communication with the plurality of memory blocks. In operation, the control circuitry receives a data write instruction and programs the memory cells of the memory blocks to a one bit per memory cell (SLC) format. In response to the data programmed to the memory cells of the memory blocks in the SLC format reaching an SLC limit prior to completion of the data write instruction, without erasing the memory cells programmed to the SLC format, the control circuitry programs the memory cells of at least some of the plurality of memory blocks from the SLC format to a two bits per memory cell (MLC) format.

20 Claims, 15 Drawing Sheets

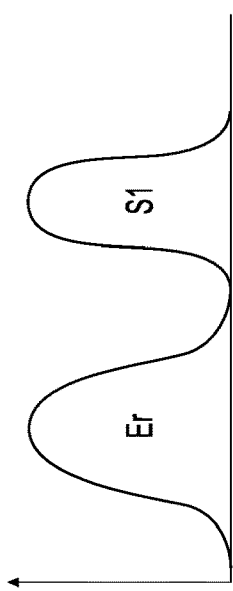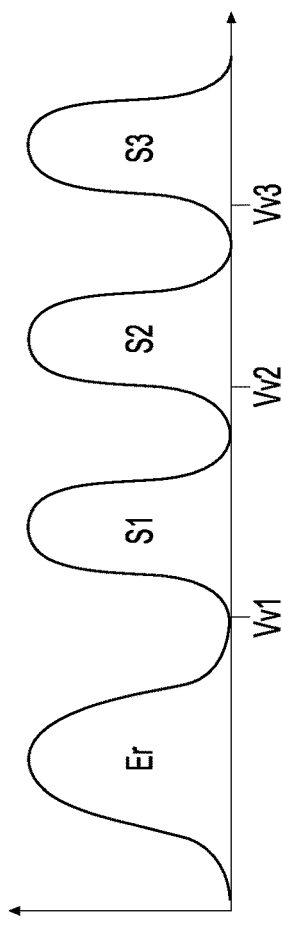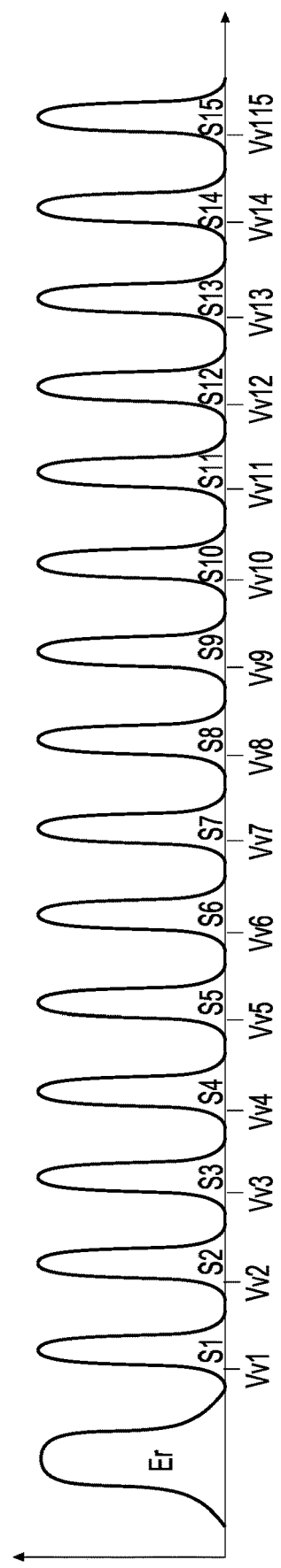
FIG. 8
FIG. 9
FIG. 10

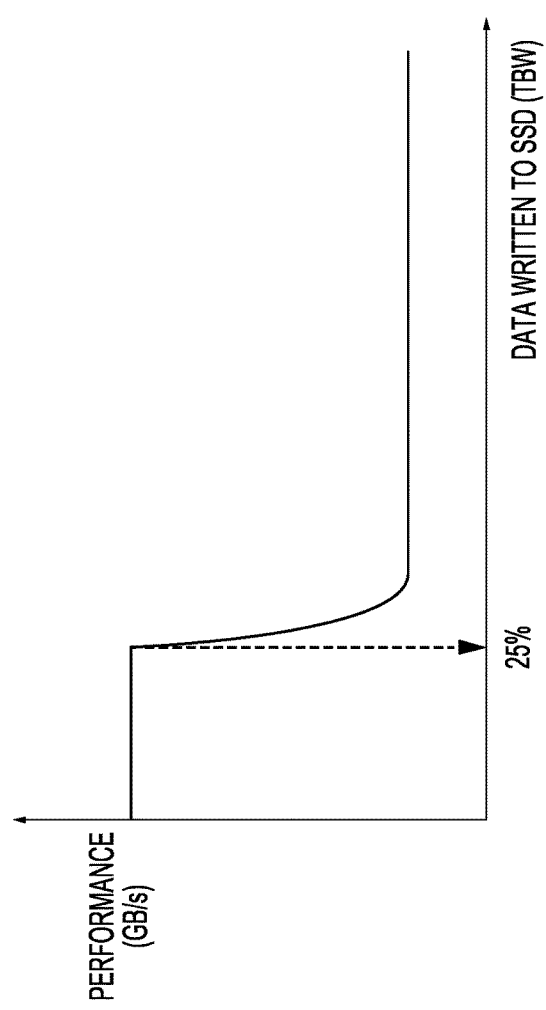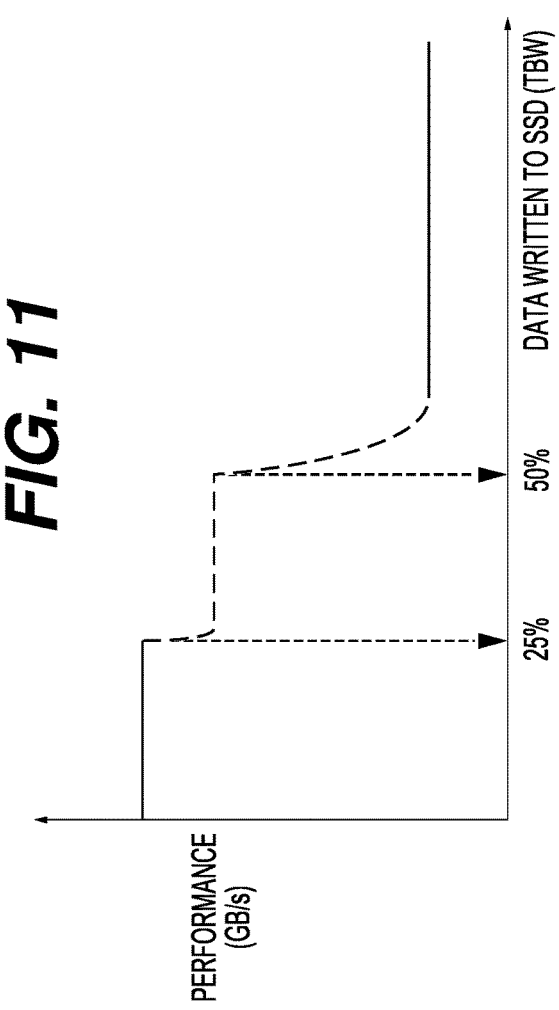

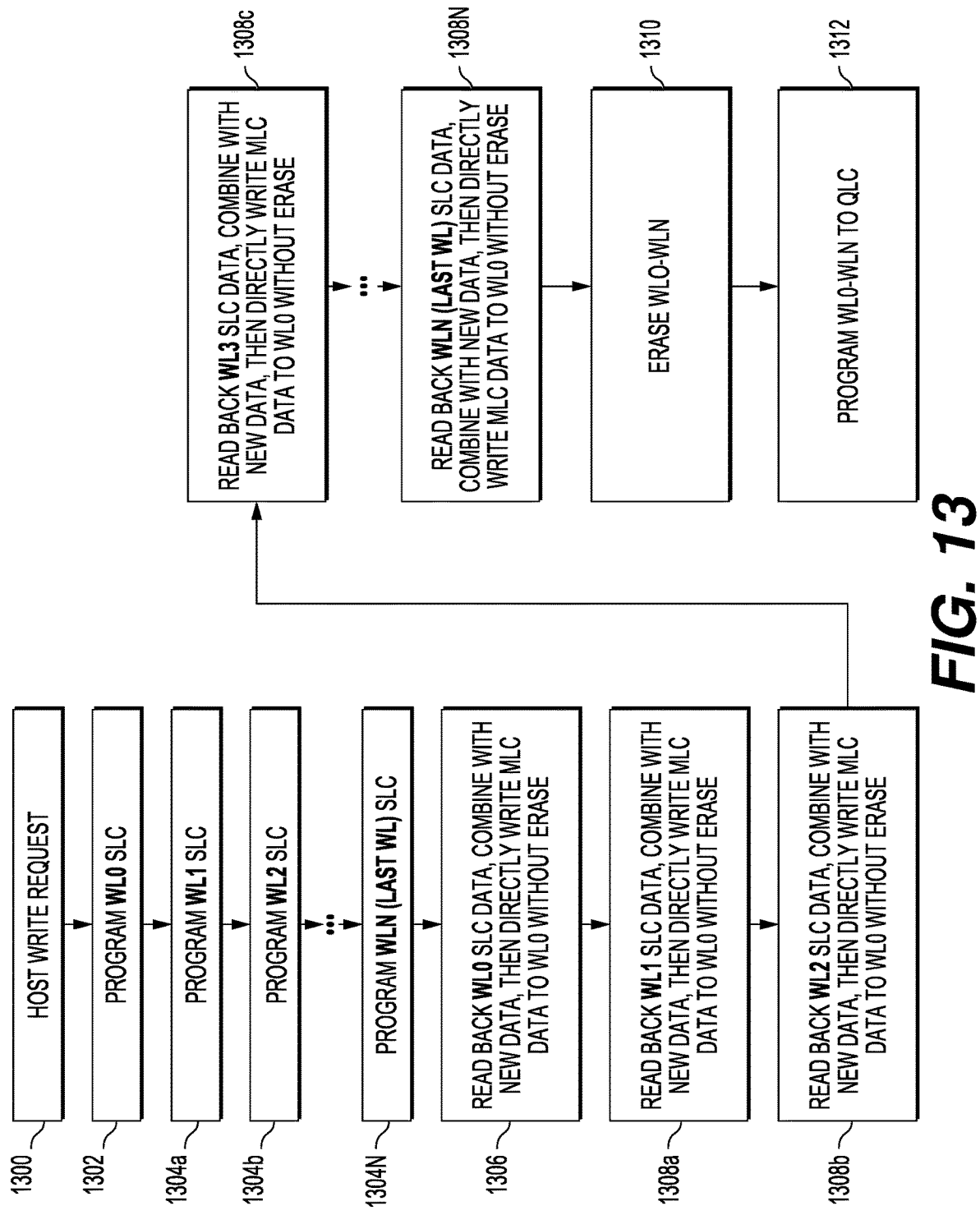

IN-PLACE WRITE TECHNIQUES WITHOUT ERASE IN A MEMORY DEVICE

BACKGROUND

1. Field

The present disclosure is related generally to memory devices and more particularly to techniques for programming memory devices.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

NAND memory device include an array of memory cells arranged in a plurality of word lines and are configured to be programmed to one or more bits of data per memory cell. In some memory devices, the memory device may be configured to operate in two different operating modes, including a high performance mode where memory cells are programmed to a single bit of data per memory cells and a low performance mode where multiple bits of data are programmed into each memory cell.

SUMMARY

One aspect of the present disclosure is related to a method of programming a memory device. The method includes the step of preparing a plurality of memory blocks which each include an array of memory cells that can be programmed to retain one or more bits of data per memory cell. The method proceeds with the step of receiving a data write instruction. The method continues with the step of programming the memory cells of the memory blocks to a one bit per memory cell (SLC) format. In response to the data programmed to the memory cells of the memory blocks in the SLC format reaching an SLC limit prior to completion of the data write instruction, without erasing the memory cells programmed to the SLC format, the method proceeds with the step of programming the memory cells of at least some of the plurality of memory blocks from the SLC format to a two bits per memory cell (MLC) format.

According to another aspect of the present disclosure, in response to an MLC limit being reached, the method further includes the step of programming the memory cells of at least some of the plurality of memory blocks from the MLC format to a three or more bits per memory cell format.

According to yet another aspect of the present disclosure, prior to programming the memory cells of at least one of the memory blocks from the MLC format to the three or more bits per memory cell format, the memory block is erased.

According to still another aspect of the present disclosure, the three or more bits per memory cell format is a four bits per memory cell (QLC) format.

According to a further aspect of the present disclosure, the SLC limit is when the memory cells of all available memory blocks are programmed to the SLC format.

According to yet a further aspect of the present disclosure, the MLC limit is when the memory cells of all available memory blocks are programmed to the MLC format.

According to still a further aspect of the present disclosure, the method further includes the step of, in a background operation, programming any data in the SLC format or the MLC format to the three or more bits per memory cell format.

According to another aspect of the present disclosure, the step of programming the memory cells of at least some of the memory blocks from the SLC format to the MLC format includes a plurality of program loops applied to each word line containing the memory cells being programmed, the program loops each including a programming pulse and a verify pulse.

According to yet another aspect of the present disclosure, the step of programming the memory cells of at least some of the memory blocks from the SLC format to the MLC format includes two programming pulses and no verify pulses applied to each word line containing the memory cells being programmed.

Another aspect of the present disclosure is related to a memory device that includes a plurality of memory blocks. The memory blocks include a plurality of memory cells arranged in a plurality of word lines. The memory device also includes control circuitry that is in communication with the plurality of memory blocks. The control circuitry is configured to receive a data write instruction and program the memory cells of the memory blocks to the SLC format. In response to the data programmed to the memory cells of the memory blocks in the SLC format reaching an SLC limit prior to completion of the data write instruction, without erasing the memory cells programmed to the SLC format, the control circuitry is configured to program the memory cells of at least some of the plurality of memory blocks from the SLC format to the MLC format.

According to another aspect of the present disclosure, in response to an MLC limit being reached, the control circuitry is further configured to program the memory cells of at least some of the plurality of memory blocks from the MLC format to a three or more bits per memory cell format.

According to yet another aspect of the present disclosure, prior to programming the memory cells of at least one of the memory blocks from the MLC format to the three or more bits per memory cell format, the control circuitry erases the memory block.

According to still another aspect of the present disclosure, the three or more bits per memory cell format is a four bits per memory cell (QLC) format.

According to a further aspect of the present disclosure, the SLC limit is when the memory cells of all available memory blocks are programmed to the SLC format.

According to yet a further aspect of the present disclosure, the MLC limit is when the memory cells of all available memory blocks are programmed to the MLC format.

According to still a further aspect of the present disclosure, in a background operation, the control circuitry programs any data in the SLC format or the MLC format to the three or more bits per memory cell format.

According to another aspect of the present disclosure, when programming the memory cells of at least some of the memory blocks from the SLC format to the MLC format, the control circuitry applies a plurality of program loops to each word line containing the memory cells being programmed. The program loops each include a programming pulse and a verify pulse.

According to yet another aspect of the present disclosure, programming of at least some of the memory blocks from the SLC format to the MLC format includes the control circuitry applying two programming pulses and no verify pulses to each word line containing the memory cells being programmed.

Yet another aspect of the present disclosure is related to an apparatus. The apparatus includes a memory device with a plurality of memory blocks that each include a plurality of memory cells arranged in a plurality of word lines. The apparatus also includes a programming means for programming data into the memory cells of the memory blocks. The programming means is configured to receive a data write instruction and program the memory cells of the memory blocks to the SLC format. In response to the data programmed to the memory cells of the memory blocks in the SLC format reaching an SLC limit prior to completion of the data write instruction, without erasing the memory cells programmed to the SLC format, the programming means is configured to program the memory cells of at least some of the plurality of memory blocks from the SLC format to the MLC format. In response to the data programmed to the memory cells of the memory blocks in the MLC format reaching an MLC limit prior to completion of the data write instruction, the programming means is configured to erase the memory cells of at least some of the memory blocks and re-program the memory cells that have been erased to a three or more bits per memory cell format.

According to another aspect of the present disclosure, when programming the memory cells from the SLC format to the MLC format, the programming means applies two programming pulses and zero verify pulses to a selected word line of the plurality of word lines.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 8 is a threshold distribution plot of a plurality of memory cells programmed to an SLC format (one bit per memory cell);

FIG. 9 is a threshold distribution plot of a plurality of memory cells programmed to an MLC format (two bits per memory cell);

FIG. 10 is a threshold distribution plot of a plurality of memory cells programmed to a QLC format (four bits per memory cell);

FIG. 11 is a plot of performance vs. data written to a memory device during an example programming operation;

FIG. 12 is a plot of performance vs. data written to a memory device during another example programming operation;

FIG. 13 is a flow chart depicting the steps of programming a memory device according to an example embodiment;

DESCRIPTION OF THE ENABLING EMBODIMENTS

The present disclosure is related to a hybrid programming technique wherein the memory device operates in a high performance SLC mode when an initial write request is received. If the memory device reaches an SLC limit before the write operation is completed, then, the memory device switches to a medium performance MLC mode and programming continues by writing additional data to the memory cells without erase. In other words, without erase, the memory device programs additional data on top of the data in the SLC format. If the memory device reaches an MLC limit before the write operation is completed, then the memory device switches to a QLC mode to complete the programming operation.

Figure 1A:
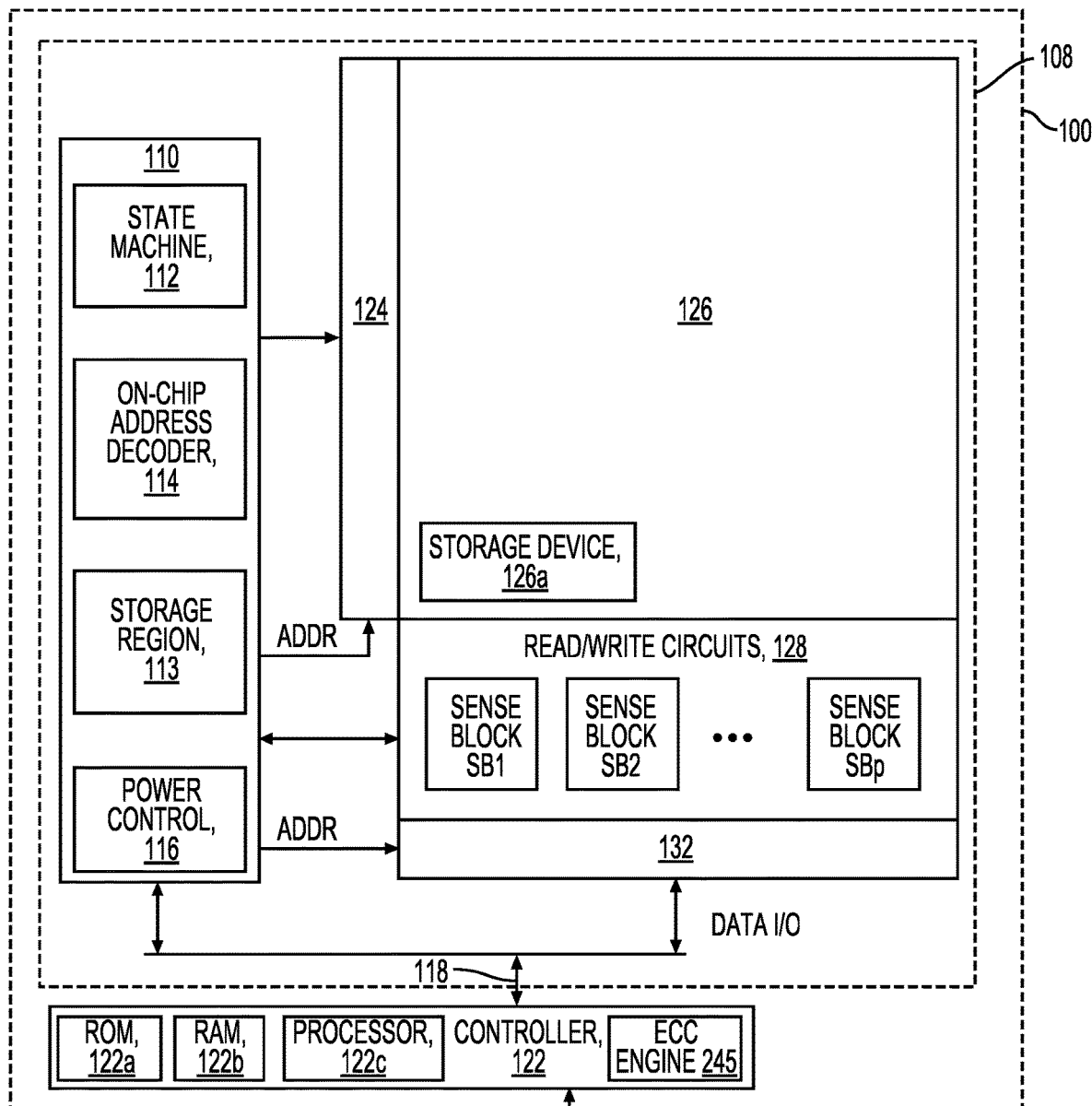
FIG. 1A is a block diagram of an example memory device.

FIG. 1A is a block diagram of an example memory device 100 that is configured to perform the aforementioned programming techniques. The memory device 100 includes a memory die 108 with a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, if a programming operation is completed.

Figure 1B:
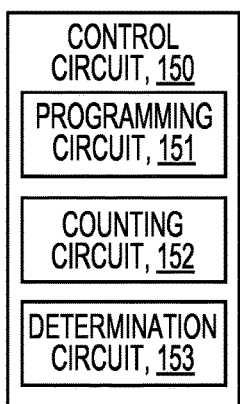
FIG. 1B is a block diagram of an example control circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
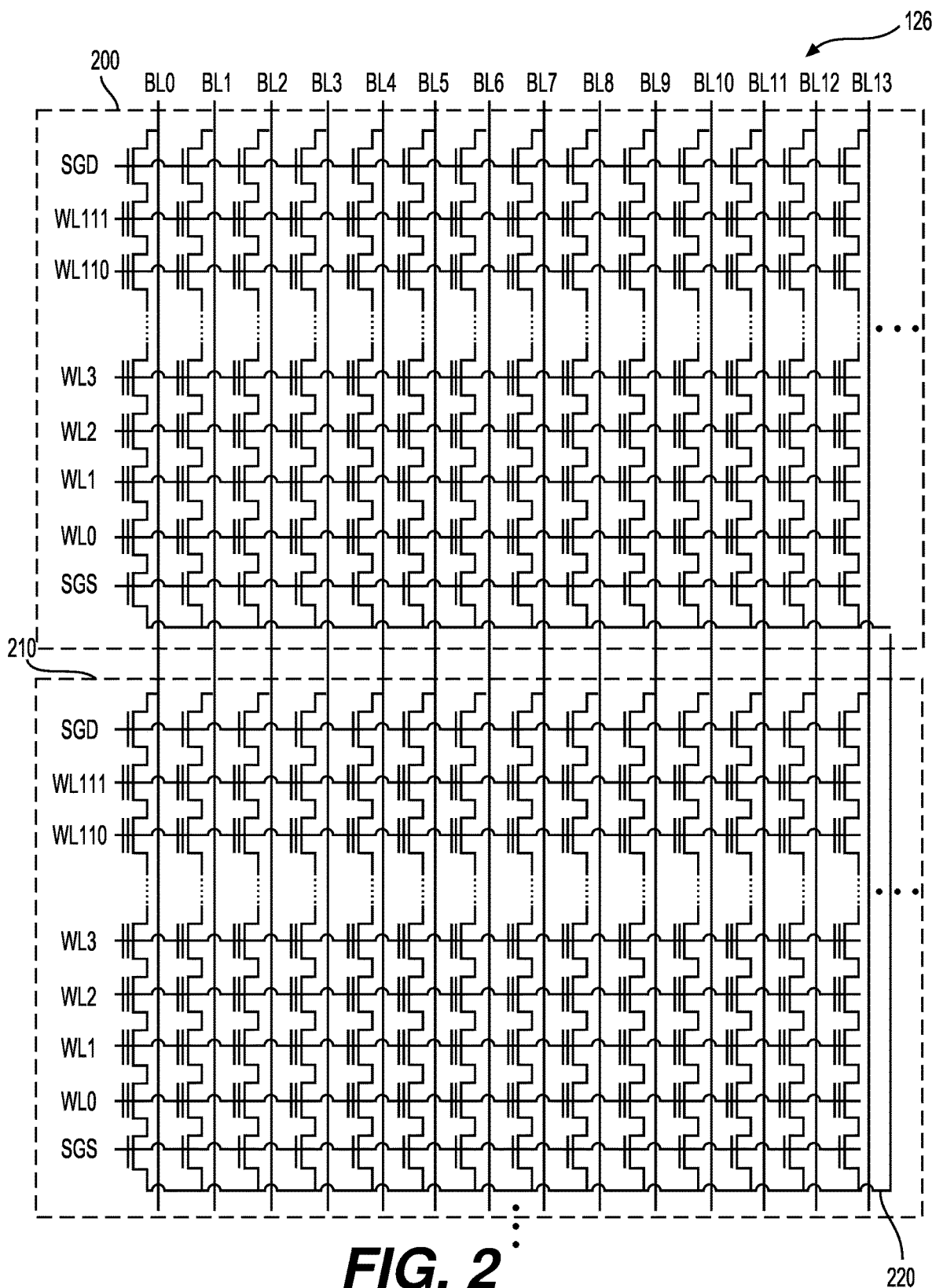
FIG. 2 depicts blocks of memory cells in an example two-dimensional configuration of the memory array of FIG. 1A.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

Figure 3A:
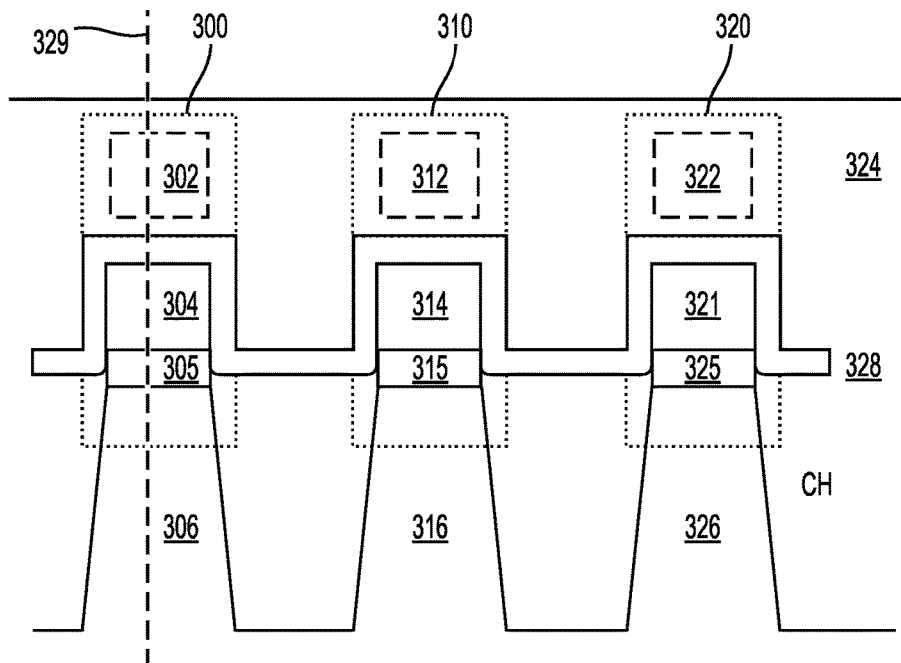
FIG. 3A and FIG. 3B depict cross-sectional views of example floating gate memory cells in NAND strings.
Figure 3B:
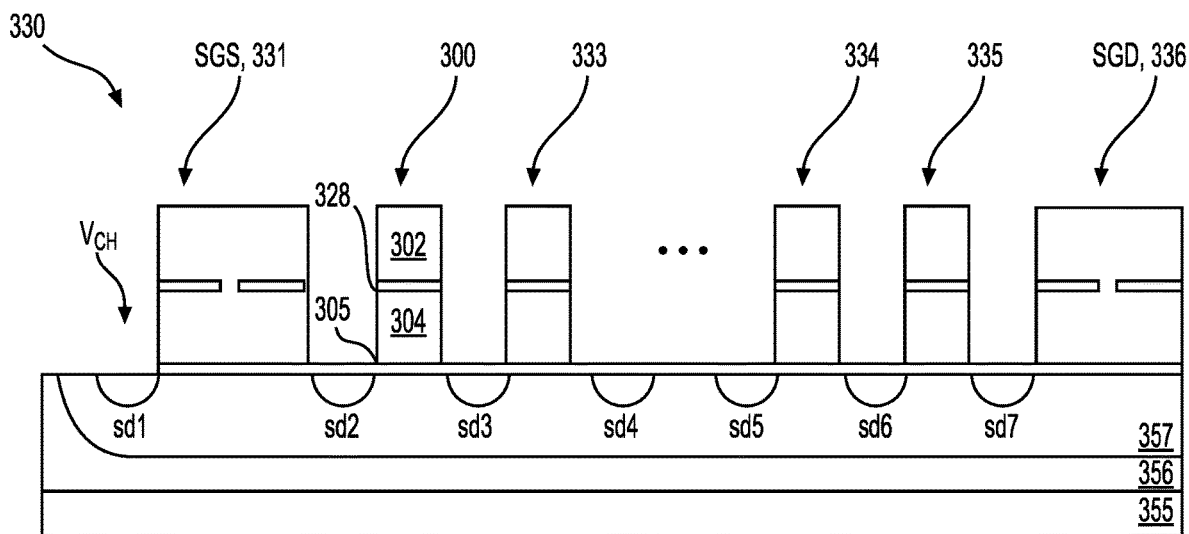

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
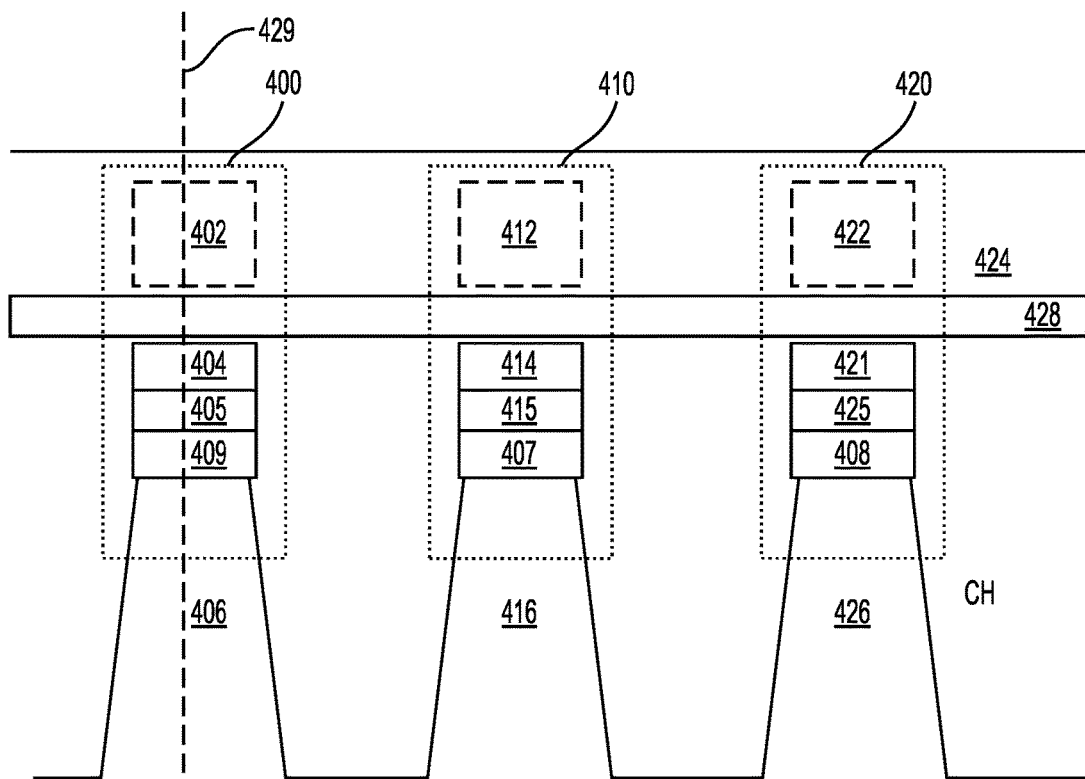
FIG. 4A and FIG. 4B depict cross-sectional views of example charge-trapping memory cells in NAND strings.
Figure 4B:
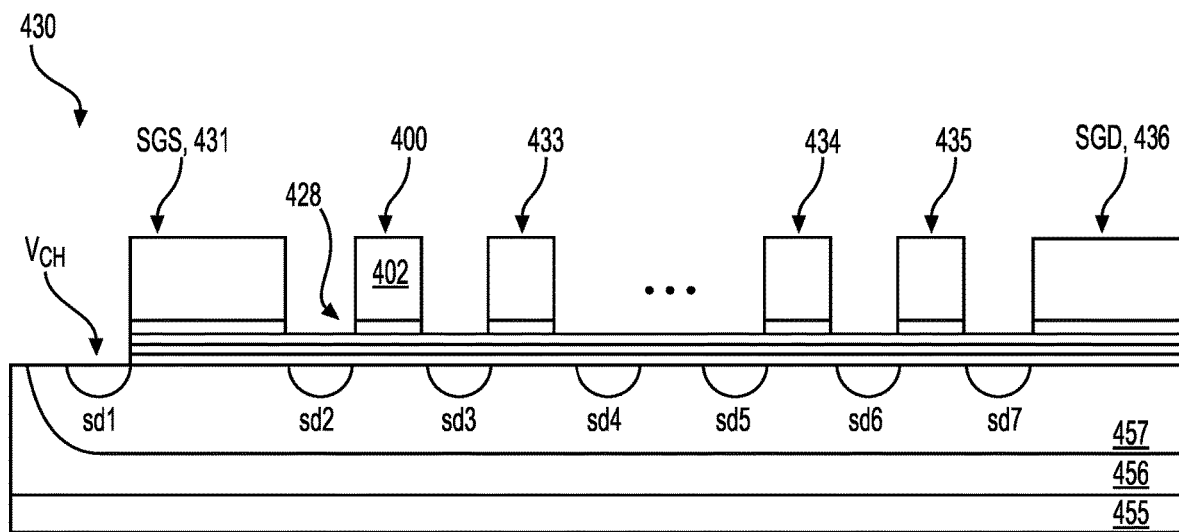

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
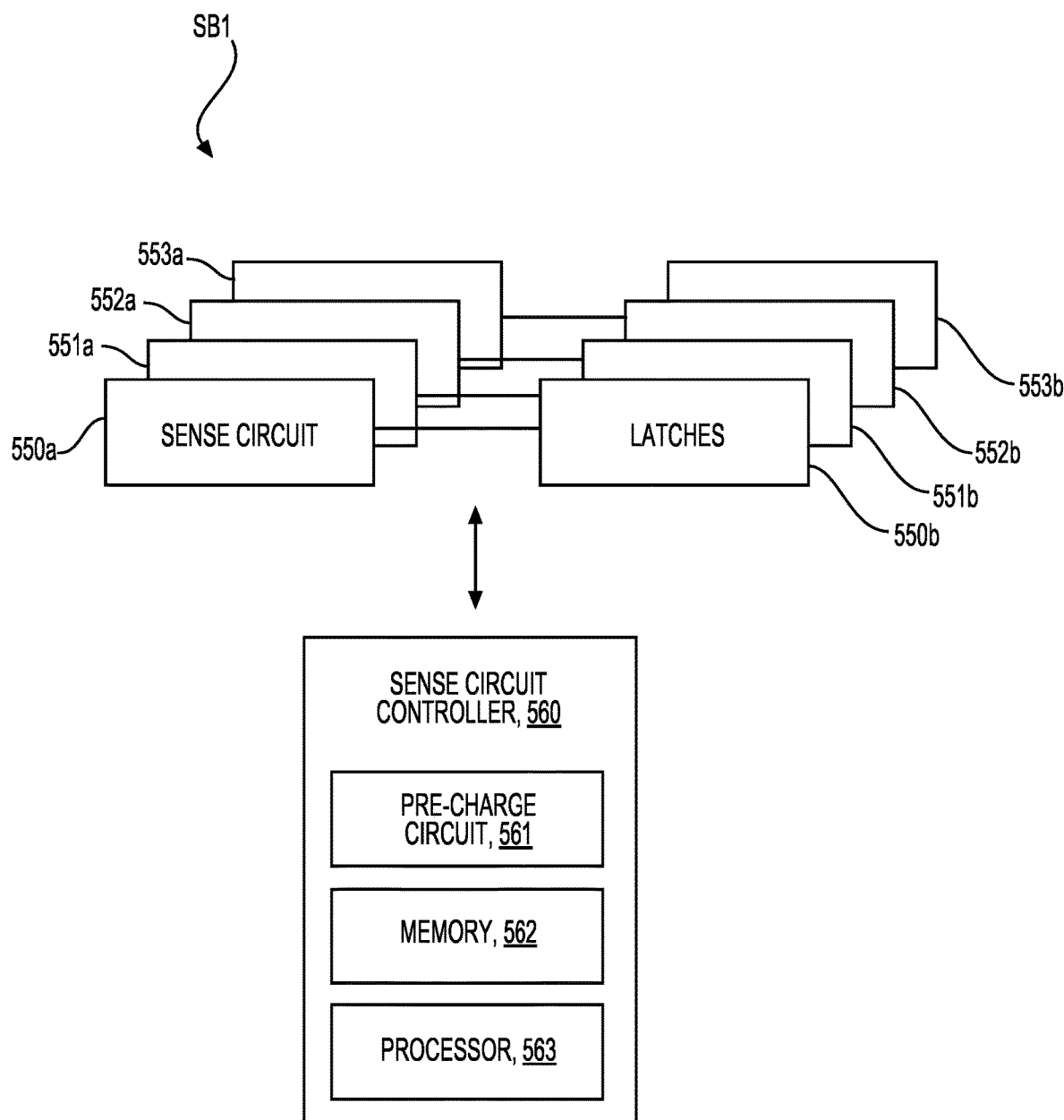
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
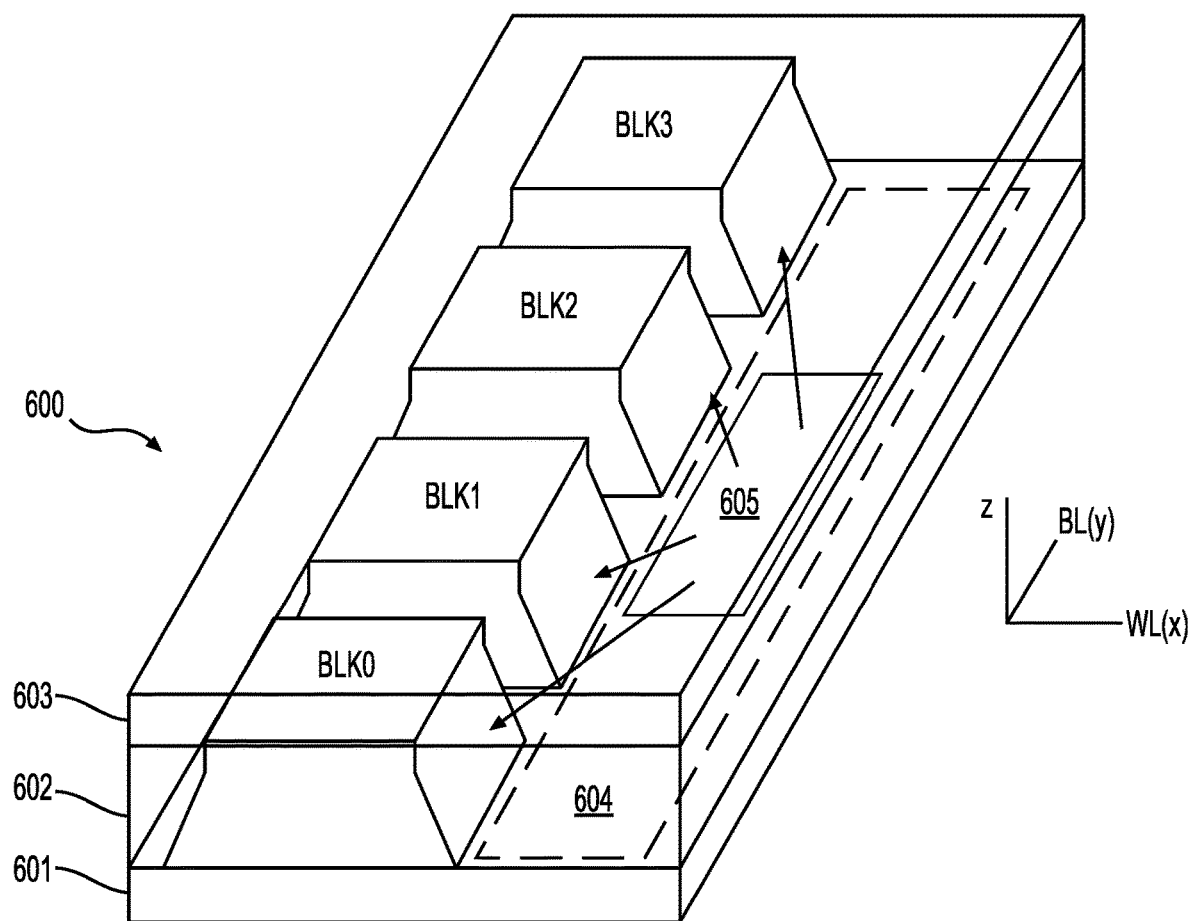
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
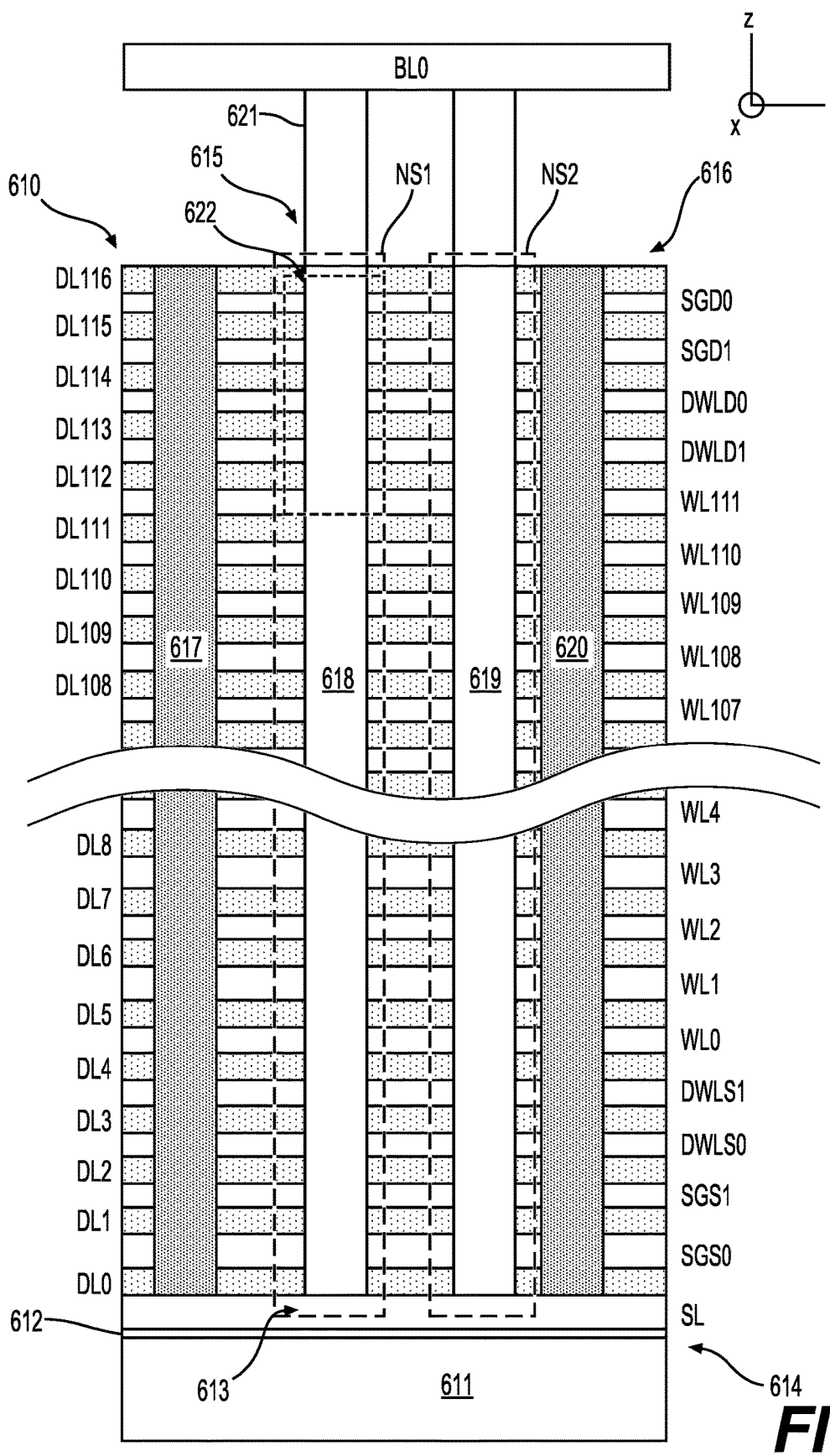
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
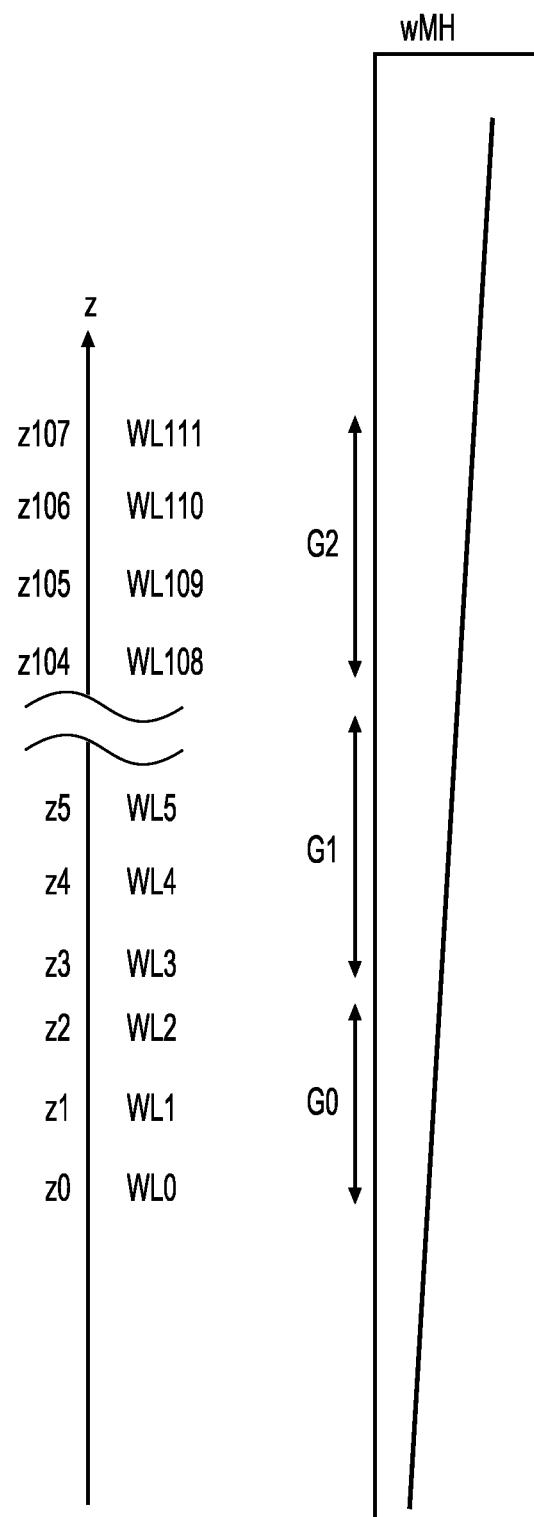
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
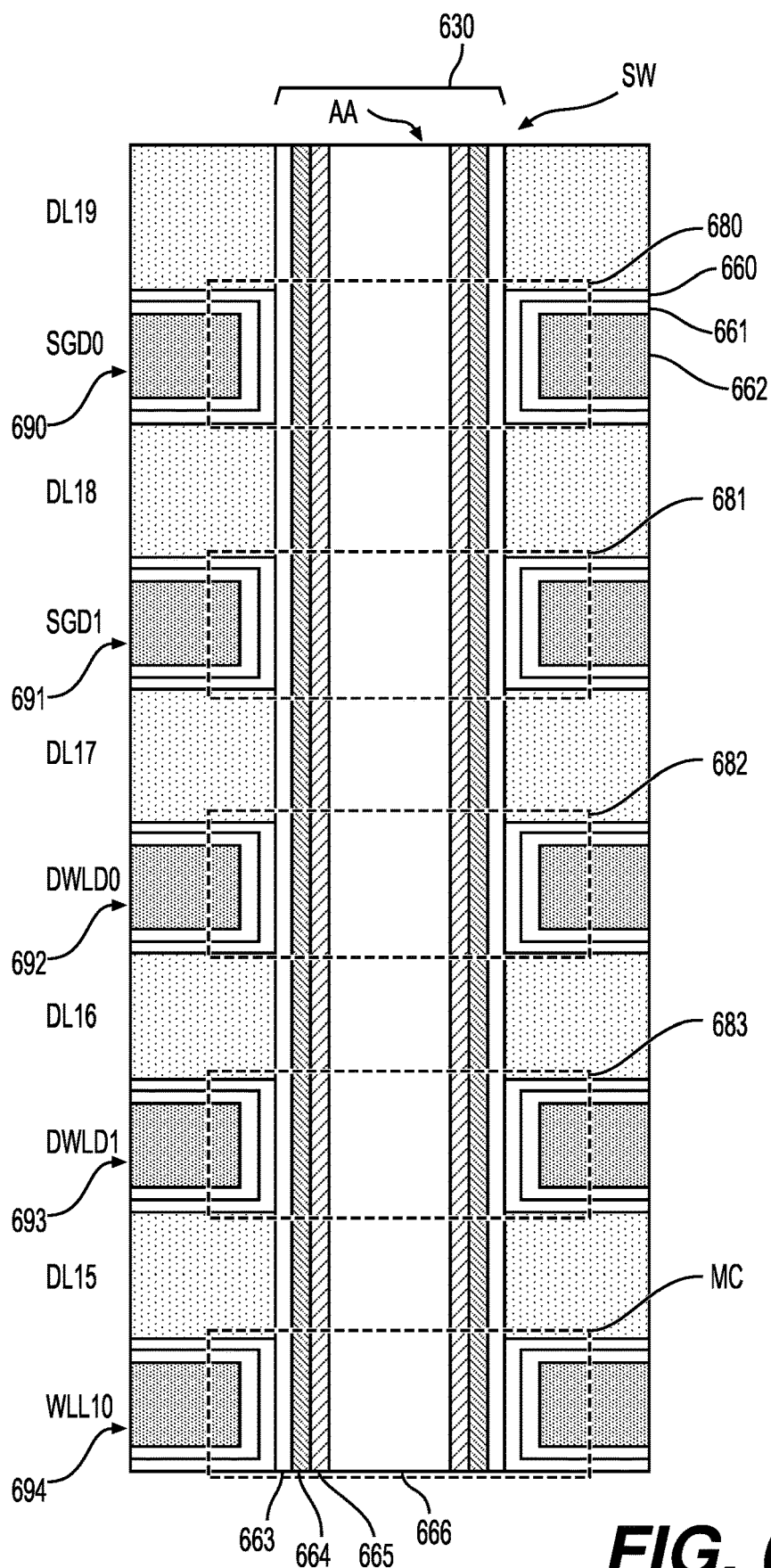
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

Figure 7A:
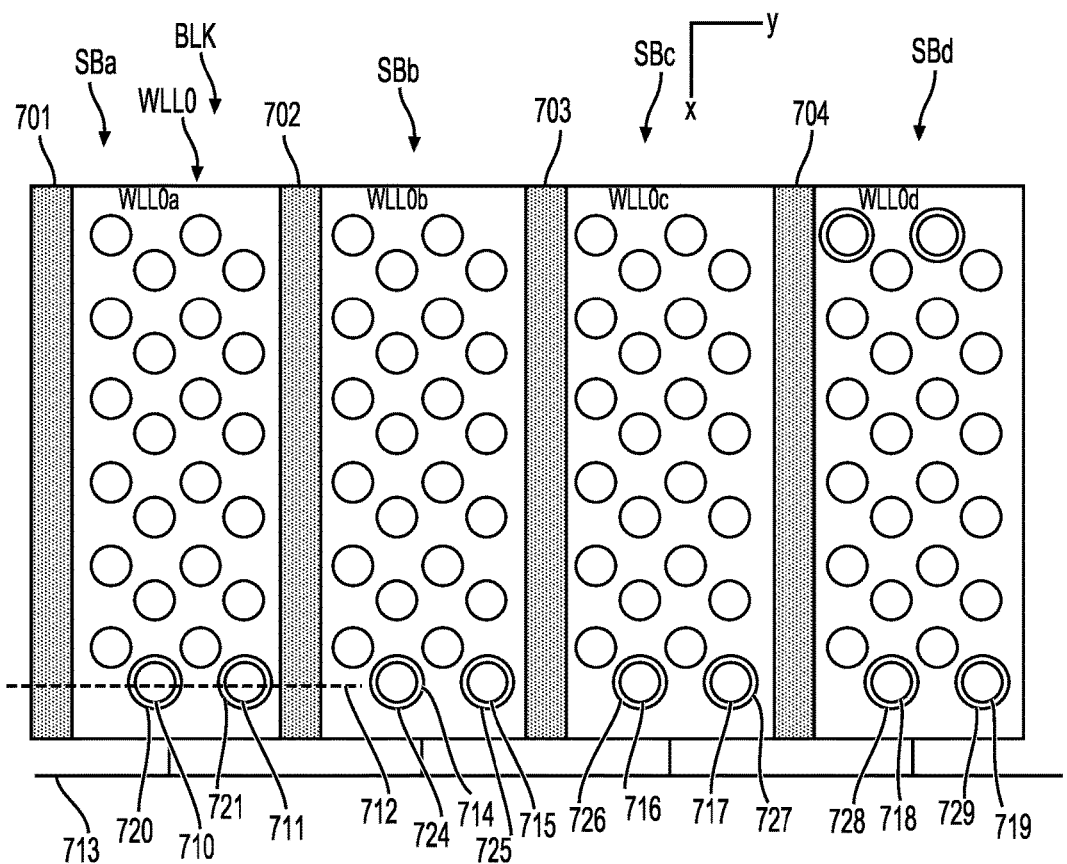
FIG. 7A depicts a top view of an example word line layer WLL0 of the stack of FIG. 6B.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 7B:
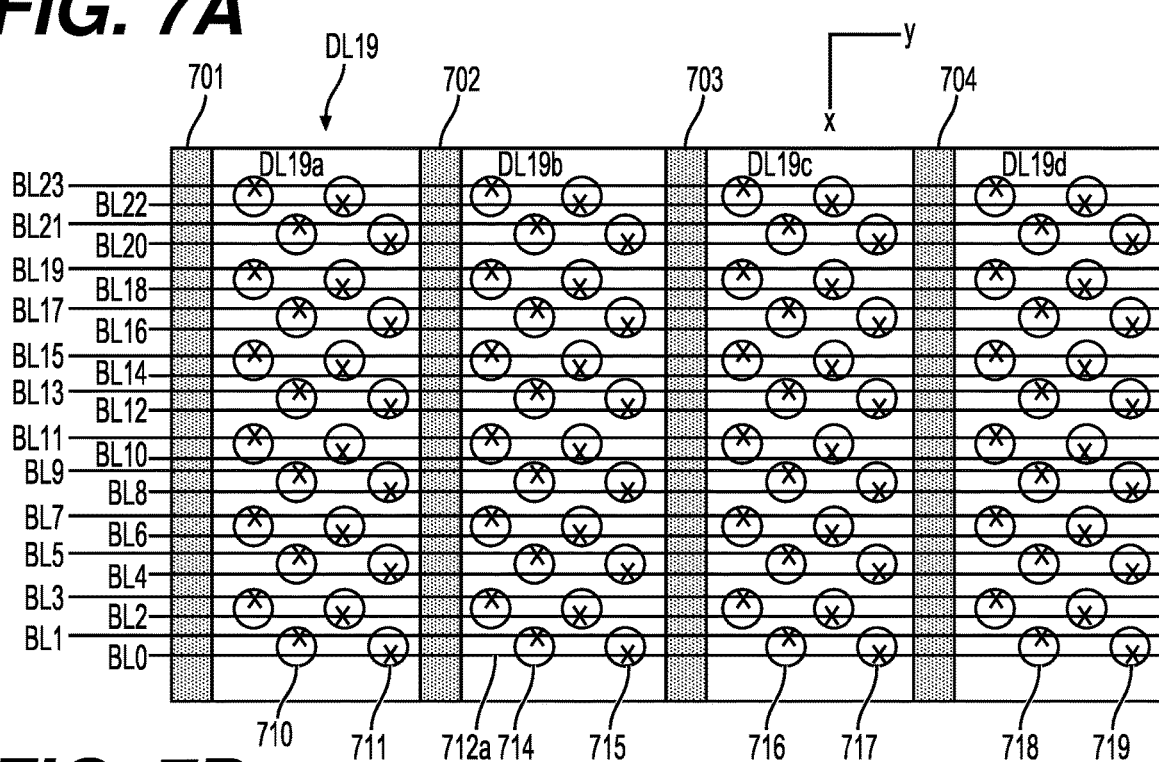
FIG. 7B depicts a top view of an example top dielectric layer DL116 of the stack of FIG. 6B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 713. The last region of a word line layer in a block can be connected to a first region of a word line layer in a next block, in one approach. The contact line 713, in turn, is connected to a voltage driver for the word line layer. The region WL0a has example memory holes 710, 711 along a contact line 712. The region WL0b has example memory holes 714, 715. The region WL0c has example memory holes 716, 717. The region WL0d has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0a, memory cells 724, 725 are in WL0b, memory cells 726, 727 are in WL0c, and memory cells 728, 729 are in WL0d. These memory cells are at a common height in the stack.

Contact line connectors (e.g., slits, such as metal-filled slits) 701, 702, 703, 704 may be located between and adjacent to the edges of the regions WL0a-WL0d. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116a, DL116b, DL116c and DL116d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116a has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

The memory cells of the memory blocks can be programmed to store one or more bits of data in multiple data states. Each data state is associated with a respective threshold voltage Vt. For example, FIG. 8 depicts a threshold voltage Vt distribution of a group of memory cells programmed according to a one bit per memory cell (SLC) storage scheme. In the SLC storage scheme, there are two total data states, including the erased state (Er) and a single programmed data state (S1). FIG. 9 illustrates the threshold voltage Vt distribution of a two bits per cell (MLC) storage scheme that includes four total data states, namely the erased state (Er) and three programmed data states (S1, S2, and S3). Each programmed data state (S1-S3) is associated with a respective verify voltage (Vv1-Vv3), which is employed during a verify portion of a programming operation. FIG. 10 depicts a threshold voltage Vt distribution of a four bits per cell (QLC) storage scheme that includes sixteen total data states, namely the erased state (Er) and fifteen programmed data states (S1-S15). Other storage schemes are also available, such as three bits per cell (TLC) with eight data states or five bits per cell (PLC) with thirty-two data states.

A programming operation generally starts with the memory cells of a page (such as a word line) in the erased data state Er. The threshold voltages of the memory cells to be programmed to one of the programmed data states are then increased to the desired levels in one or more program-verify iterations or program loops, each of which includes the application of a programming pulse Vpgm to a control gate of a selected word line followed by, optionally, a verify pulse in a verify operation. Depending on whether or not an inhibit voltage is applied to a bit line coupled with a memory cell, electrons may or may not be captured in the charge trapping material of the memory cell to either program or not program the memory cell. Specifically, if an inhibit voltage is applied to a bit line, then electrons are restricted from entering the charge trapping material of the memory cell operably connected with that bit line and thus that memory cell's threshold voltage Vt does not increase. Conversely, if no inhibit voltage is applied to a bit line, then electrons are not restricted from entering the charge trapping material of the memory cell operably connected with that bit line and a threshold voltage Vt of that memory cell increases.

In many programming operations, the voltage of the programming pulse Vpgm is increased by a fixed step size dVpgm between programming loops. During the optional verify operation, the threshold voltage Vt of a memory cell being programmed is checked in the verify operation to see if it is at the desired level. If the memory cell is not at the desired level, then further programming of that memory cell continues. Conversely, if the threshold voltage Vt of the memory cell is greater than a desired level associated with the data state the memory cell is being programmed to, then further programming of that memory cell is inhibited in subsequent program loops.

When programming the memory cells to a low number of bits per memory cell (e.g., SLC or MLC), in some programming techniques, the verify operation is not necessary and may be skipped to improve performance (reduce programming time). For example, in one SLC programming technique known as 1P0V, the memory cells of a selected word line are programmed with only one programming pulse and zero verify pulses. In one MLC programming technique known as 3P0V, the programming operation includes three programming pulses and zero verify pulses.

In some memory dies, the memory blocks may be configured to operate in multiple storage scheme modes, e.g., an SLC mode and a TLC mode or an SLC mode and a QLC mode. Such a memory device may be configured to initially write data to memory blocks operating in an SLC mode, which offers high performance. Then, in a background operation when performance is not important, the memory device can re-program that data from the SLC format to a multi-bit per memory cell format (for example, QLC) for long-term storage.

If a write request contains more data than the memory device has capacity for in the SLC format, then once the SLC capacity has been reached, the memory device must transition to the QLC mode during the (non-background) write operation. This may significantly reduce performance. For example, FIG. 11 depicts a plot of performance (as measured in gigabytes written per second [GB/s]) vs. data written (as measured in terabytes written [TBW]) for a memory device during an example programming operation where the data to be written exceeds the SLC limit of the memory device. As illustrated, the memory device operates at a very high performance while writing data in the SLC mode until it reaches twenty-five percent (25%) of its available data capacity at the beginning of the programming operation. This limit is reached when all of the memory blocks in the memory device that were available at the beginning of the programming operation have been programmed to the SLC format. After this point, SLC programming cannot continue because there are no remaining open blocks, and therefore, the data already programmed in SLC format is re-programmed to the QLC format along with additional data until either the programming operation is completed or the data capacity of the memory device is reached. In a new or fully erased memory device where all of the memory blocks are open blocks, the data capacity is the maximum data capacity of the memory device, e.g., 256 GB, 512 GB, 1 TB, etc. If some data has already been programmed to the memory device and is in the long-term QLC format, then the available data capacity is the remaining open data capacity of the memory device at the beginning of the programming operation.

One aspect of the present disclosure is related to a programming technique similar to the one discussed above but where the memory device transitions from an SLC mode to an MLC mode when the SLC limit is reached and then transitions to a QLC mode when an MLC limit is reached, i.e., there is a medium performance MLC mode between the high performance SLC mode and the low performance QLC mode. With reference to FIG. 12, according to this aspect of the present disclosure, while operating in the SLC mode, the memory device has a first (highest) performance level when programming data from zero to twenty-five percent (0-25%) of the available data capacity of the memory device at the beginning of the programming operation. Once the memory device reaches its SLC limit, it switches operation from the SLC mode to the MLC mode and programs data at a second (medium) performance level from twenty-five to fifty percent (25-50%) of the available data capacity at the beginning of the programming operation. Finally, once the memory device reaches its MLC limit, it switches operation from the MLC mode to the QLC mode programs any remaining data to be written at a third (lowest) performance level from fifty to one hundred percent (50-100%) of the total data capacity.

In other words, the memory device first programs data at high performance to the SLC limit, then programs data at medium performance to the MLC limit, and finally programs the data at low performance in the QLC format from then on.

In an example embodiment, a fully erased memory device with a 1 TB data available capacity, receives instructions from a host to write 1 TB of data to the memory device. The memory device will initially operate at a very high performance while in the SLC mode to program the first 256 GB of data to the memory blocks of the memory device. Then, the memory device will switch operation from the SLC mode to the MLC mode. Without erasing the memory blocks, the memory cells will be directly programmed from the SLC format to the MLC format to program the next 256 GB of data (512 GB total) into the memory device. Finally, with the memory device at the MLC limit, the memory device switches operation from the MLC mode to the QLC mode and programs the remaining 512 GB of data using a low performance QLC programming operation. The memory blocks may be erased prior to QLC programming.

If the programming operation is completed prior to the memory device reaching the data capacity of the memory device, then in a background operation, the memory device programs any data stored in SLC format or MLC format to QLC format, thereby freeing up available data capacity for a future programming operation according to the above-discussed hybrid SLC/MLC/QLC programming technique in a future programming operation while leaving the already written data in QLC format unchanged. In this case, the available data capacity and the SLC and MLC limits will be reduced accordingly.

FIG. 13 is a flow chart depicting the steps of a first embodiment of programming a memory device using the aforementioned programming techniques. At step 1300, the memory device receives a write request from a host device.

Figure 14B:
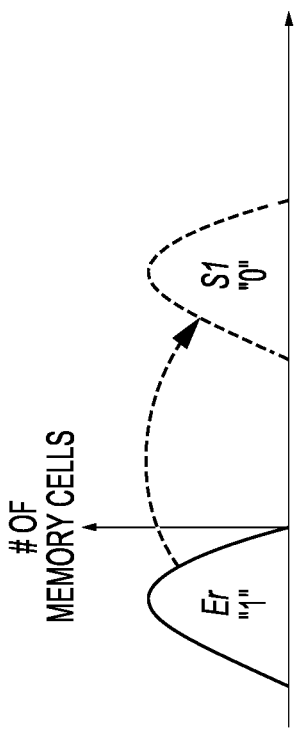
FIG. 14B is a threshold voltage distribution plot of the plurality of memory cells after an SLC programming operation.
Figure 14D:
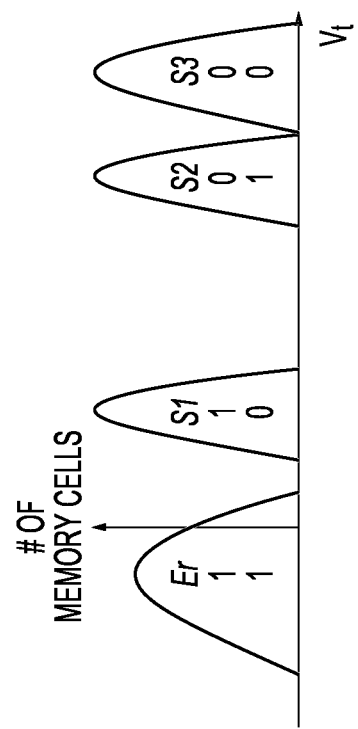
FIG. 14D is a threshold voltage distribution plot of the plurality of memory cells programmed to MLC format according to the first embodiment.
Figure 14A:
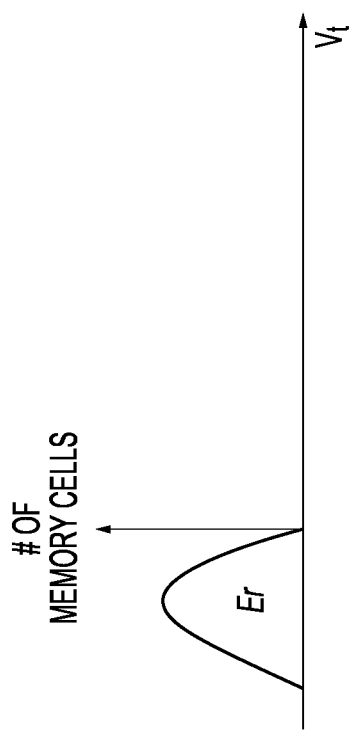
FIG. 14A is a threshold voltage distribution plot of a plurality of memory cells before a programming operation begins.

At step 1302, a first word line WL0 of a memory block is programmed to SLC format in an SLC programming operation. As shown in FIG. 14A, programming WL0 begins with all of the memory cells of WL0 being in the erased data state (Er). Next, a first page of data is written to the memory cells of the selected word line by applying at least one programming pulse to WL0 and inhibiting programming in the memory cells to remain in the erased data state (Er) so that the threshold voltages of only those memory cells being programmed to the first programmed data state (S1) are raised, as illustrated in FIG. 14B. For reasons discussed in further detail below, the voltage gap between the erased state Er and the S1 data state is great enough to fit another data state therebetween. In this example, the memory cells in the erased data state (Er) are assigned the "1" bit, and the memory cells in the S1 data state are assigned the "0" bit.

At steps 1304a-N, the process of step 1302 is repeated for all remaining word lines WL1-WLN of a memory block and for all available memory blocks in the memory device until either the write operation is completed or until all available memory cells of all available memory blocks have been programmed to SLC format. In other words, the memory blocks are closed with all of the memory cells being in SLC format prior to any of the word lines being programmed to MLC format, and if the write request from the host is completed prior to the memory device reaching the SLC limit, then the operation ceases. If the write request is completed at this stage, then the data programmed to SLC format may be re-programmed from SLC format to QLC format in a background operation at a later time.

Figure 14C:
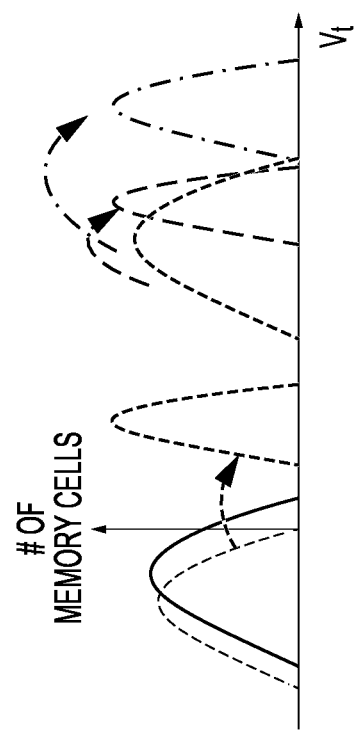
FIG. 14C is a threshold voltage distribution plot of the plurality of memory cells during a programming operation where the memory cells are programmed from SLC format to MLC format according to a first embodiment.
Figure 15A:
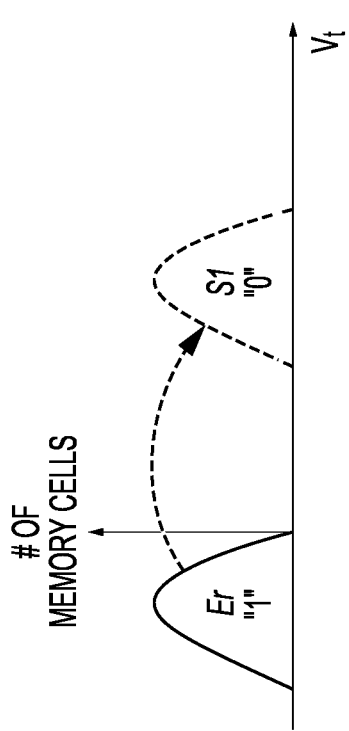
FIG. 15A is a threshold voltage distribution plot of a plurality of memory cells before a programming operation begins.
Figure 15C:
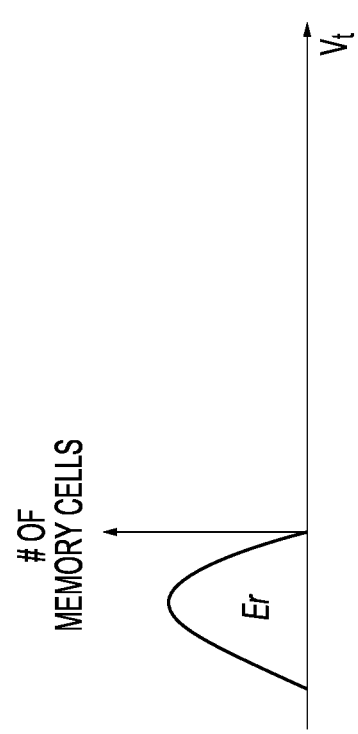
FIG. 15C is a threshold voltage distribution plot of the plurality of memory cells during a programming operation where the memory cells are programmed from SLC format to MLC format according to a second embodiment.
Figure 15B:
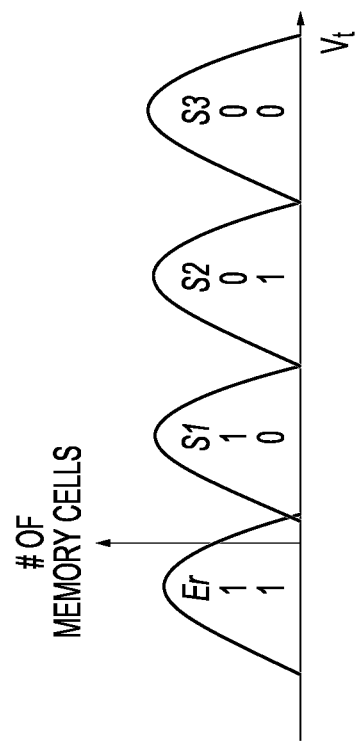
FIG. 15B is a threshold voltage distribution plot of the plurality of memory cells after an SLC programming operation.
Figure 15D:
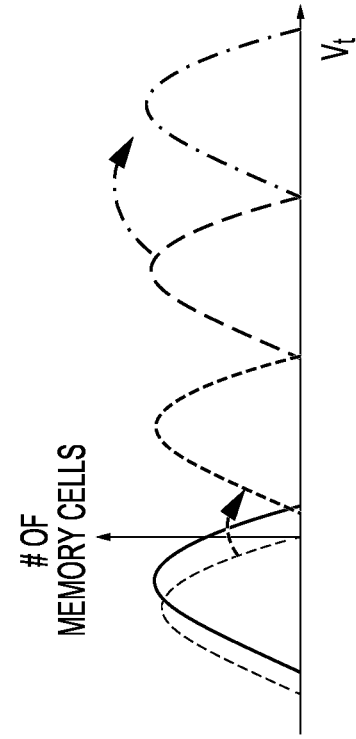
FIG. 15D is a threshold voltage distribution plot of the plurality of memory cells programmed to MLC format according to the second embodiment.

If additional data to be written remains after the SLC limit has been reached, then the process proceeds to step 1306. At step 1306, the memory device reads back the data of the first word line WL0 using an internal data latch (IDL) read operation, combines the first page of data with additional user data, and directly writes the additional data to the memory cells of WL0 without erasing the memory cells of the first word line. As illustrated in FIGS. 14C and 14D, the memory cells of the erased data state Er either are inhibited to remain in the erased data state Er or are programmed to a new first data state S1, and the memory cells of the old first data state S1 are either programmed to a new S2 data state or a new S3 data state. By doing this, a second page of data is written to the memory cells of the selected word line. In the exemplary embodiment, the memory cells in the erased data state Er are associated with bits "1 (first page), 1 (second page)," the memory cells in the new S1 data state may be associated with bits "1, 0," the memory cells in the S2 data state may be associated with bits "0, 1," and the memory cells in the S3 data state may be associated with bits "0, 0." In other embodiments, the data states may be associated with different bits.

At steps 1308a-N, the process of step 1306 is repeated for all remaining word lines WL1-WLN of the memory block and for all available memory blocks in the memory device until either the write operation is completed or until all available memory cells of all available memory blocks have been programmed to MLC format.

During this process, if the write request is completed prior to the memory device reaching the MLC limit, then the operation ceases and the data is re-programmed from SLC or MLC format to QLC format for long term storage in a background operation. If the write request is not completed prior to the memory device reaching the MLC limit, then the memory cells of the memory block are erased at step 1310 and programming to QLC format begins at step 1312. Prior to erasing the memory blocks at step 1310, the data of a memory block, may be read and stored temporarily in another location (such as an extended memory block that does not count towards the available data capacity) prior to re-programming the word lines of the memory block to include the previous data and additional data.

In one embodiment, the process of programming each of the word lines WL0-WLN from the SLC format to the MLC format at steps 1306 and 1308 includes one or more program loops with verify operations to tighten the threshold voltage Vt distributions of data states S1-S3. Once each memory cell passes the verify voltage associated with its intended data state, further programming of that memory cell is inhibited during any remaining program loops. Programming of the word line continues until a threshold number of memory cells reach their intended data states or until a maximum number of program loops is reached.

In another embodiment, the process of programming each of the word lines WL0-WLN from the SLC format to the MLC format at steps 1306 and 1308 includes two programming pulses and zero verify pulses (2P0V). With reference to FIGS. 15A-D, in this embodiment, during MLC programming, a first programming pulse is applied to the selected word line to program some of the memory cells in the erased state Er to create the new S1 data state, and a second programming pulse is applied to the selected word line to program some of the memory cells in the old S1 data state (now the S2 data state) into the new S3 data state. In order to improve performance, neither of these programming pulses is followed by verify, and programming of the selected word line is completed following the second programming pulse. A very large step size dVpgm is employed to increase the magnitude of the programming pulse Vpgm from the first programming pulse to the second programming pulse.

In some embodiments, rather than proceeding from writing to MLC to QLC upon reaching the MLC limit, the memory device may be configured to write to TLC.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or mores," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of programming a memory device, comprising the steps of:
preparing a plurality of memory blocks, the memory blocks including an array of memory cells that can be programmed to retain one or more bits of data per memory cell;
receiving a data write instruction;
programming the memory cells of the memory blocks to a one bit per memory cell (SLC) format that includes a first SLC data state and a second SLC data state; and
in response to the data programmed to the memory cells of the memory blocks in the SLC format reaching an SLC limit prior to completion of the data write instruction, without erasing the memory cells programmed to the SLC format, programming the memory cells of at least some of the plurality of memory blocks from the SLC format to a two bits per memory cell (MLC) format, and
wherein the step of programming the memory cells from the SLC format to the MLC format includes inhibiting at least some of the memory cells in the first SLC data state to form a first MLC data state, programming at least some of the memory cells in the first SLC data state to form a second MLC data state, programming at least some of the memory cells in the second SLC data state to form a third MLC data state, and programming at least some of the memory cells in the second SLC data state to form a fourth MLC data state.

2. The method of programming the memory device as set forth in claim 1, wherein, in response to an MLC limit being reached, the method further includes the step of programming the memory cells of at least some of the plurality of memory blocks from the MLC format to a three or more bits per memory cell format.

3. The method of programming the memory device as set forth in claim 2, wherein prior to programming the memory cells of at least one of the memory blocks from the MLC format to the three or more bits per memory cell format, the memory block is erased.

4. The method of programming the memory device as set forth in claim 3, wherein the three or more bits per memory cell format is a four bits per memory cell (QLC) format.

5. The method of programming the memory device as set forth in claim 2, wherein the SLC limit is when the memory cells of all available memory blocks are programmed to the SLC format.

6. The method of programming the memory device as set forth in claim 5, wherein the MLC limit is when the memory cells of all available memory blocks are programmed to the MLC format.

7. The method of programming the memory device as set forth in claim 2, further including the step of, in a background operation, programming any data in the SLC format or the MLC format to the three or more bits per memory cell format.

8. The method of programming the memory device as set forth in claim 1, wherein the step of programming the memory cells of at least some of the memory blocks from the SLC format to the MLC format includes a plurality of program loops applied to each word line containing the memory cells being programmed, the program loops each including a programming pulse and at least one verify pulse.

9. The method of programming the memory device as set forth in claim 1, wherein the step of programming the memory cells of at least some of the memory blocks from the SLC format to the MLC format includes two programming pulses and no verify pulses applied to each word line containing the memory cells being programmed.

10. A memory device, comprising:
a plurality of memory blocks including a plurality of memory cells arranged in a plurality of word lines;
control circuitry in communication with the plurality of memory blocks, the control circuitry being configured to:
receive a data write instruction, program the memory cells of the memory blocks to a one bit per memory cell (SLC) format that includes a first SLC data state and a second SLC data state, in response to the data programmed to the memory cells of the memory blocks in the SLC format reaching an SLC limit prior to completion of the data write instruction, without erasing the memory cells programmed to the SLC format, program the memory cells of at least some of the plurality of memory blocks from the SLC format to a two bits per memory cell (MLC) format, and wherein when programming the memory cells of at least some of the plurality of memory blocks from the SLC format to the MLC format, the circuitry inhibits at least some of the memory cells in the first SLC data state to form a first MLC data state, programs at least some of the memory cells in the first SLC data state to form a second MLC data state, programs at least some of the memory cells of the second SLC data state to form a third MLC data state, and programs at least some of the memory cells of the second SLC data state to form a fourth MLC data state.

11. The memory device as set forth in claim 10, wherein, in response to an MLC limit being reached, the control circuitry is further configured to program the memory cells of at least some of the plurality of memory blocks from the MLC format to a three or more bits per memory cell format.

12. The memory device as set forth in claim 11, wherein prior to programming the memory cells of at least one of the memory blocks from the MLC format to the three or more bits per memory cell format, the control circuitry erases the memory block.

13. The memory device as set forth in claim 12, wherein the three or more bits per memory cell format is a four bits per memory cell (QLC) format.

14. The memory device as set forth in claim 11, wherein the SLC limit is when the memory cells of all available memory blocks are programmed to the SLC format.

15. The memory device as set forth in claim 14, wherein the MLC limit is when the memory cells of all available memory blocks are programmed to the MLC format.

16. The memory device as set forth in claim 11, wherein, in a background operation, the control circuitry programs any data in the SLC format or the MLC format to the three or more bits per memory cell format.

17. The memory device as set forth in claim 10, wherein when programming the memory cells of at least some of the memory blocks from the SLC format to the MLC format, the control circuitry applies a plurality of program loops to each word line containing the memory cells being programmed, the program loops each including a programming pulse and at least one verify pulse.

18. The memory device as set forth in claim 10, wherein programming of at least some of the memory blocks from the SLC format to the MLC format includes the control circuitry applying two programming pulses and no verify pulses to each word line containing the memory cells being programmed.

19. An apparatus, comprising:

a memory device including a plurality of memory blocks that each include a plurality of memory cells arranged in a plurality of word lines;

a programming means for programming data into the memory cells of the memory blocks, the programming means being configured to;

receive a data write instruction, program the memory cells of the memory blocks to a one bit per memory cell (SLC) format that includes a first SLC data state and a second SLC data state, in response to the data programmed to the memory cells of the memory blocks in the SLC format reaching an SLC limit prior to completion of the data write instruction, without erasing the memory cells programmed to the SLC format, program the memory cells of at least some of the plurality of memory blocks from the SLC format to a two bits per memory cell (MLC) format, wherein when programming the memory cells of at least some of the plurality of memory blocks from the SLC format to the MLC format, the programming means inhibits at least some of the memory cells in the first SLC data state to form a first MLC data state, programs at least some of the memory cells in the first SLC data state to form a second MLC data state, programs at least some of the memory cells of the second SLC data state to form a third MLC data state, and programs at least some of the memory cells of the second SLC data state to form a fourth MLC data state, and in response to the data programmed to the memory cells of the memory blocks in the MLC format reaching an MLC limit prior to completion of the data write instruction, erase the memory cells of at least some of the memory blocks and re-program the memory cells that have been erased to a three or more bits per memory cell format.

20. The apparatus as set forth in claim 19, wherein when programming the memory cells from the SLC format to the MLC format, the programming means applies two programming pulses and zero verify pulses to a selected word line of the plurality of word lines.

* * * * *